United States Patent
Bradfield et al.

(10) Patent No.: US 7,531,925 B2
(45) Date of Patent: May 12, 2009

(54) HIGH CURRENT CAPACITY RECTIFIER PACKAGE

(75) Inventors: Michael D. Bradfield, Anderson, IN (US); Brad L. Auler, Muncie, IN (US); Samuel R. Edrington, Noblesville, IN (US)

(73) Assignee: Remy International, Inc., Anderson, IN (US)

( * ) Notice: Subject to any disclaimer, the term of this patent is extended or adjusted under 35 U.S.C. 154(b) by 73 days.

(21) Appl. No.: 11/789,134

(22) Filed: Apr. 24, 2007

(65) Prior Publication Data

US 2008/0265700 A1    Oct. 30, 2008

(51) Int. Cl.
*H02K 11/00* (2006.01)
(52) U.S. Cl. .................................... 310/68 D
(58) Field of Classification Search ............... 310/68 D, 310/58, 64, 71

See application file for complete search history.

(56) References Cited

U.S. PATENT DOCUMENTS 6,911,750 B2    6/2005    Bradfield et al. .......... 310/68 D

*Primary Examiner*—Javaid Nasri
(74) *Attorney, Agent, or Firm*—Cantor Colburn LLP

(57) ABSTRACT

Disclosed is a dynamoelectric machine having improved heat dissipation capabilities. The dynamoelectric machine includes a three-phase stator winding with a rectifier assembly electrically connected to the stator winding. The rectifier assembly includes an end frame having at least one negative diode contained therein and a positive heat sink which has at least one positive diode disposed therein. Connecting the negative diodes and positive diodes is a terminal assembly. The terminal assembly includes one or more electrically conductive and heat dissipative straps. The straps electrically connect one or more negative diodes and one or more positive diodes. Also disclosed is a method for dissipating heat from a rectifier of a dynamoelectric machine.

23 Claims, 4 Drawing Sheets

HIGH CURRENT CAPACITY RECTIFIER PACKAGE

BACKGROUND OF THE INVENTION

The present invention relates generally to dynamoelectric machines. More specifically, this invention relates to the cooling of a rectifier and/or stator of dynamoelectric machines.

A common application of a dynamoelectric machine is to utilize it as an alternator in a motor vehicle. The alternator produces three-phase alternating current which is rectified into a direct current. This energy can be stored in a battery of the motor vehicle or used by the electrical circuitry of the vehicle which utilizes direct current (DC) voltage. The three-phase alternating current is rectified to direct current by means of a rectifier bridge having a plurality of diodes, commonly either 6 diodes for a normal three-phase alternator or 12 diodes for a parallel three-phase alternator. Half of the diodes (either 3 or 6) are positive diodes. Each positive diode is connected between a phase terminal of a stator winding of the alternator and a positive terminal of the alternator. The positive terminal is connected to the battery and the electrical circuitry of the vehicle. The remaining diodes are negative diodes and are each connected between a phase terminal of the stator winding and electrical ground of the vehicle.

The diodes can experience current in excess of 200 amps. This level of current creates a significant amount of heat that must be dissipated to preserve alternator function and reliability. Heat is typically dissipated via carrier plates that the diodes are embedded in. The carrier plates act as heat sinks and may include fins which are exposed to cooling air. With this configuration, heat from the diodes is transferred to the carrier plates and to the fins where the heat is radiated to the atmosphere.

Current rectifier and heat sink configurations do not provide sufficient cooling to maintain component temperatures at a safe, reliable level in alternators where an output current exceeds 200 amps. The art would well receive an improved rectifier and heat sink configuration to sufficiently dissipate heat from the components in high current alternators.

SUMMARY OF THE INVENTION

A rectifier for a dynamoelectric machine includes an end frame having at least one negative diode disposed therein which is electrically connectable to a stator winding of the dynamoelectric machine. Included is a positive heat sink having at least one positive diode disposed therein which is electrically connectable to the stator winding. A terminal assembly including one or more electrically conductive and heat dissipative straps electrically connects one or more negative diodes and one or more positive diodes.

A method for dissipating heat from a rectifier of a dynamoelectric machine includes conducting heat into the end frame from at least one negative diode disposed therein. The positive heat sink conducts heat from at least one positive diode disposed therein. The straps of the terminal assembly further conduct heat from the negative diodes and the positive diodes into the terminal assembly. Cooling air is urged through the rectifier to radiate heat from the end frame, the positive heat sink, and or the straps.

DESCRIPTION OF THE DRAWINGS

The above, as well as other advantages of the present invention, will become readily apparent to those skilled in the art from the following detailed description when considered in the light of the accompanying drawings in which.

DETAILED DESCRIPTION OF THE INVENTION

Figure 1:
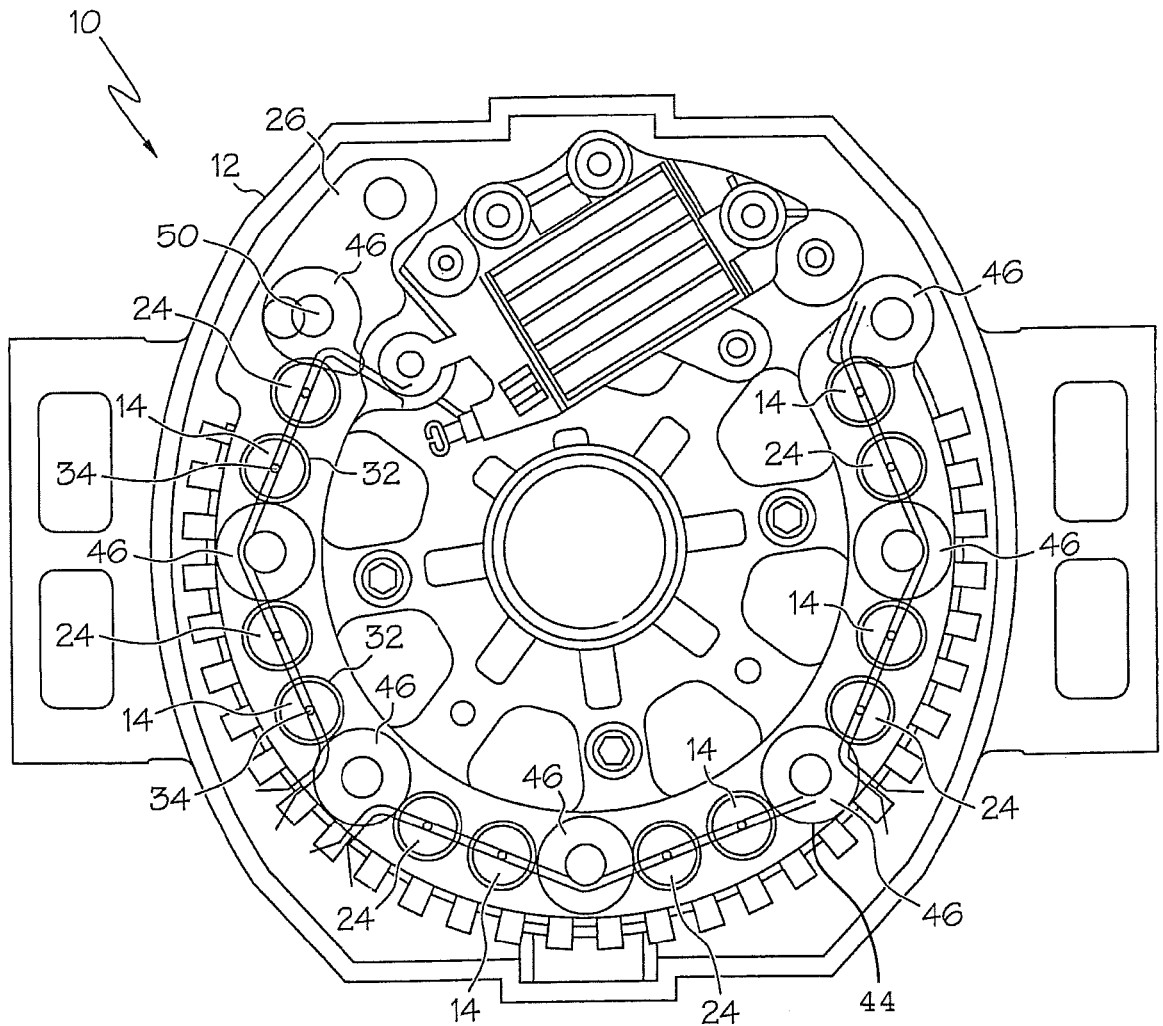
FIG. 1 is an embodiment of a rectifier for a dynamoelectric machine.

Shown in FIG. 1 is an embodiment of a bridge rectifier 10 of a three-phase alternator (not shown). The rectifier 10 includes an end frame 12 having at least one negative diode 14 disposed therein. In the embodiment shown in FIG. 1, six negative diodes 14 are disposed in the end frame 12, but it is to be appreciated that other quantities of negative diodes 14 are contemplated within the scope of this invention. Each negative diode 14 is electrically connected to a phase of a three-phase stator winding (not shown). In the example shown in FIG. 1 where rectifier 10 has six negative diodes 14, two negative diodes 14 are connected to each phase of the three-phase stator winding.

Figure 2:
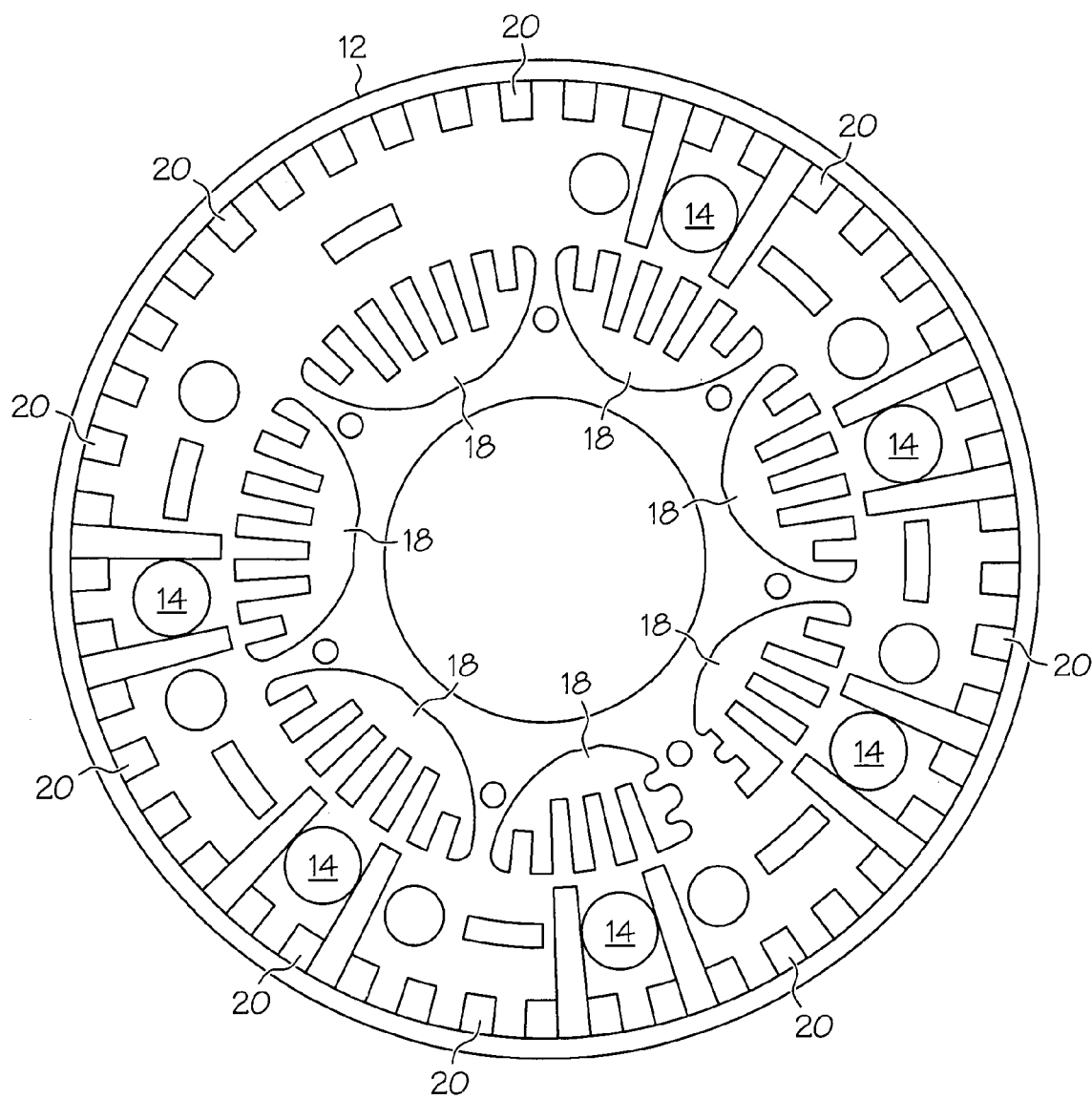
FIG. 2 is a view of an embodiment of an end frame of the rectifier of FIG. 1.

Referring now to FIG. 2, the negative diodes 14 are disposed in apertures in frame face 16. The end frame 12 in this example is cast aluminum, but other materials for end frame 12 are contemplated within the scope of this invention. The end frame 12 is configured as an electrically and thermally conductive element (a negative heat sink) of the rectifier 10. The end frame 12 conducts heat from the negative diodes 14 which is then radiated to the atmosphere. To encourage airflow through the end frame 12 and thereby increase its heat transfer capacity, a plurality of inner vents 18 are disposed radially inward of the negative diodes 14, and a plurality of outer vents 20 are disposed radially outward of the negative diodes 14. The inner vents 18 and outer vents 20 shown in one embodiment are elongated slots, but other vent 18, 20 shapes are contemplated within the scope of this invention. The outer vents 20, in particular, aid in radiating heat from an outer wall 22 which extends axially from the frame face 12. The outer wall 22 adds a significant amount of surface area to the end frame 12, thereby increasing a cooling capacity of the end frame 12. An additional benefit of the outer wall 22 is that it provides mechanical protection for the rectifier 10 from physical damage due to handling or while in use in a vehicle.

Returning to FIG. 1, at least one positive diode 24 is located in a positive heat sink 26 which is located directly over the negative diodes 14 disposed in the end frame 12. In the embodiment shown in FIG. 1, positive diodes 24 are disposed in the positive heat sink 24, but it is to be appreciated that other quantities of positive diodes 24 are contemplated within the scope of this invention. Each positive diode 24 is electrically connected to a phase of a three-phase stator winding (not shown). In the example shown in FIG. 1 where rectifier 10 has six positive diodes 24, two positive diodes 24 are connected to each phase of the three-phase stator winding.

Figure 3:
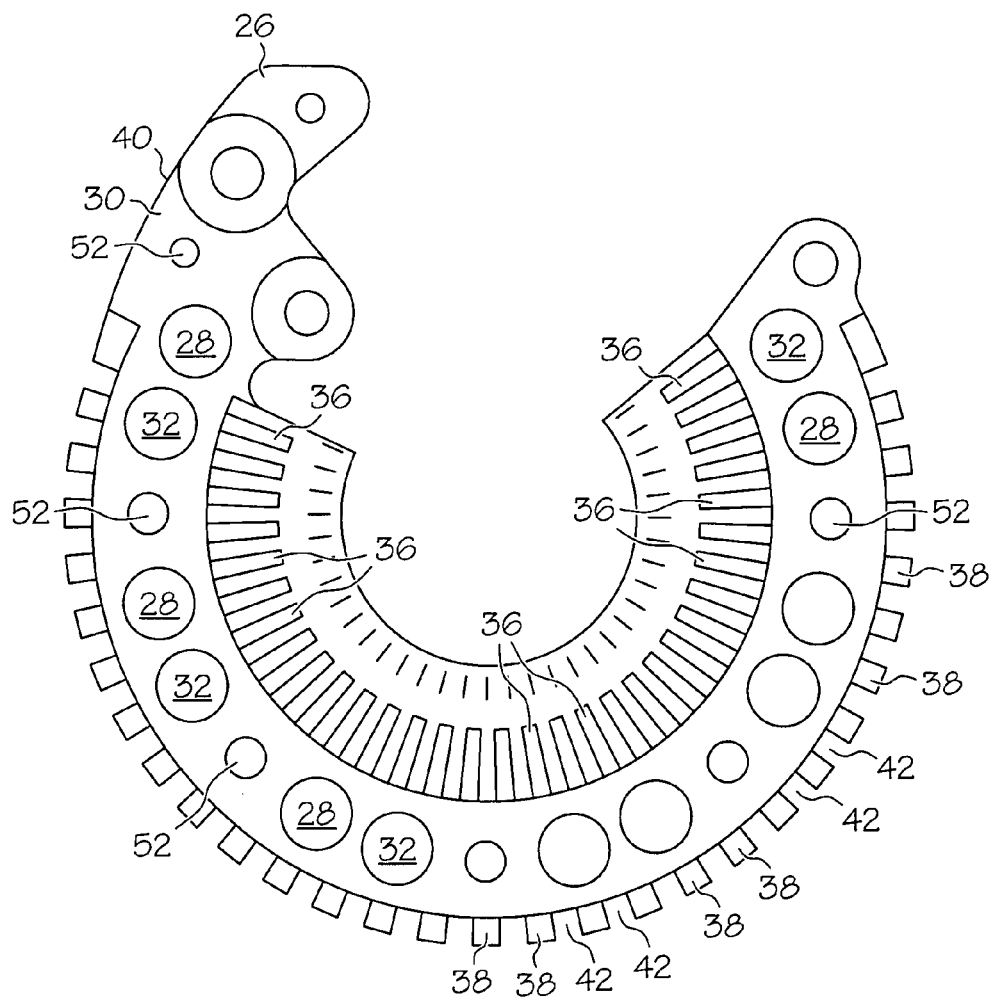
FIG. 3 is a view of an embodiment of a positive heat sink of the rectifier of FIG. 1.

As shown in FIG. 3, the positive heat sink 26 is configured with at least one diode opening 28 in a positive heat sink face 30 for receiving the positive diodes 24 and at least one of lead hole 32 in the positive heat sink face 30 configured such that a negative diode lead 34 from each of the negative diodes 14 extends through each of the lead holes 32. The positive heat sink 26 is formed from a thermally conductive material, and is configured to conduct heat from the positive diodes 24. A plurality of inner fins 36 extend from the positive heat sink face 30 and are disposed radially inboard of the positive diodes 24. The inner fins 36 increase the surface area of the positive heat sink 26 thereby increasing the efficiency of heat transfer from the positive diodes 24. The positive heat sink 26 further includes a plurality of outer fins 38 extending from the positive heat sink face 30 at a perimeter 40 of the positive heat sink 26. In one embodiment, the inner fins 36 and outer fins 38 extend radially and/or axially from the positive heat sink 26, but it is to be appreciated that the invention is not limited to fins extending radially and/or axially.

Figure 4:
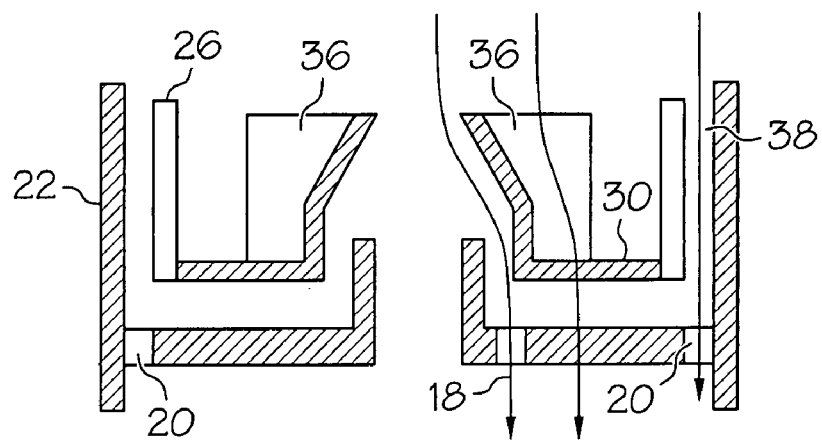
FIG. 4 is a sectional view of the rectifier of FIG. 1, depicting cooling air flow through the rectifier.

Cooling air is provided to the rectifier 10 by a centrifugal fan (not shown) or other means, which directs air substantially axially through the alternator and, as shown in FIG. 4, through the inner vents 18 and outer vents 20 in the end frame 12, and through slots 42 defined by adjacent fins 38 in the positive heat sink, thus increasing the cooling performance of the fan. Additionally, the location and configuration of vents 18 and 20 and slots 42 causes cooling air through the alternator to impinge directly on end turns of one or more stator windings (not shown). This aids in keeping the stator windings uniformly and efficiently cooled.

Referring again to FIG. 1, a terminal assembly 44 is attached to the positive heat sink 26. The terminal assembly 44 comprises a plurality of bosses 46 connected to each other by electrically conductive and heat dissipative straps 48. One or more of the bosses 46 each includes a terminal hole 50 which corresponds with one or more screw holes 52 in the positive heat sink 26 thus allowing connection of the terminal assembly 44 to the positive heat sink 26 via a screw (not shown) or other means.

Figure 5:
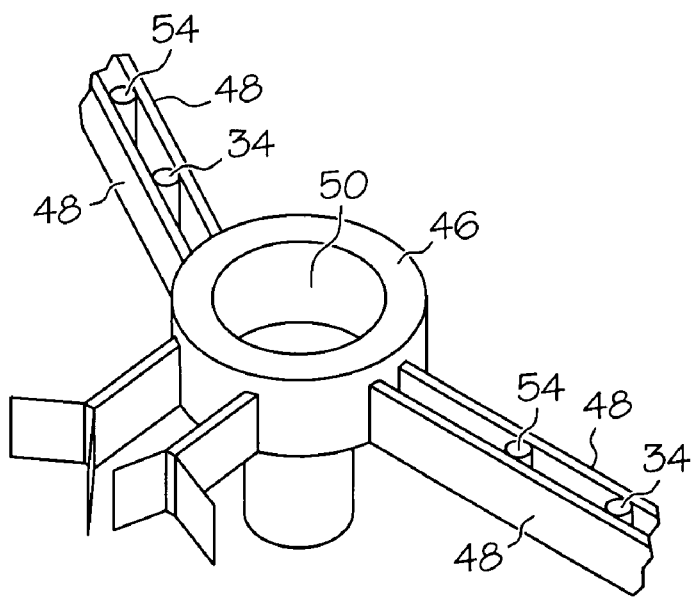
FIG. 5 is an enlarged view of a detail of a terminal assembly of the rectifier of FIG. 1.

As illustrated in FIG. 5, the straps 48 are arranged in a dual configuration, meaning that each negative diode lead 34 and each positive diode lead 54 is electrically connected to two straps 48. The invention is not limited, however, to the utilization of two straps 48 to connect each negative diode lead 34 and each positive diode lead 54. Other quantities of straps 48, for example, three or four, may be utilized. Further, in one embodiment the straps 48 are electrically connected to each negative diode lead 34 and each positive diode lead 54 by welding, although it is appreciated that other means of connection are contemplated within the scope of the invention. In one embodiment, the straps 48 are further configured and arranged such that the two positive diodes 24 and the two negative diodes 14 electrically connected to a phase of the stator winding are electrically connected to one another in parallel. By having multiple positive diodes 24 and multiple negative diodes 14 a current capability of the rectifier 10 is increased, and thermal characteristics for a current are improved due to a spatial distribution of a heat load among the multiple diodes. Because of the heat dissipating characteristics of the straps 48, the terminal assembly 44 itself becomes a source for cooling the negative diodes 14 and the positive diodes 24 by allowing heat to radiate from the straps 48. In one embodiment, the straps 48 are substantially bare, thus adding to their heat dissipating capacity. Arranging the straps 48 in a dual configuration provides a larger cross-sectional area for electrical conduction, thereby reducing ohmic heating of the straps 48 and provides a larger surface area for removal of heat from the negative diodes 14 and the positive diodes 24.

In an alternative embodiment, three negative diodes 14 are included in the rear frame 12, and three positive diodes 24 are included in the positive heat sink 26. The positive diodes 24 and negative diodes 14 are electrically connected to the phases of the three phase stator winding such that one negative diode 14 and one positive diode 24 are electrically connected to each phase of the stator winding.

While embodiments of the invention have been described above, it will be understood that those skilled in the art, both now and in the future, may make various improvements and enhancements which fall within the scope of the claims which follow. These claims should be construed to maintain the proper protection for the invention first described.

What is claimed is:

1. A rectifier for a dynamoelectric machine comprising:
an end frame having at least one negative diode disposed therein, the at least one negative diode electrically connectable to a stator winding of the dynamoelectric machine;
a positive heat sink having at least one positive diode disposed therein, the at least one positive diode electrically connectable the stator winding of the dynamoelectric machine; and
a terminal assembly including:
a plurality of bosses, one boss of the plurality of bosses disposed at each negative diode of the at least one negative diode and each positive diode of the at least one positive diode; and
at least two electrically conductive and heat dissipative straps, the straps extending between the plurality of bosses, electrically connecting one or more negative diodes and one or more positive diodes, the straps substantially bare between bosses of the plurality of bosses.

2. The rectifier of claim 1 wherein the at least two straps are disposed in a configuration such that each positive diode and each negative diode are electrically connected to at least two straps.

3. The rectifier of claim 1 wherein the end frame includes at least one vent slot to increase a flow of cooling air through the rectifier.

4. The rectifier of claim 1 wherein the end frame includes an outer wall disposed at least partially perimetrically around and extending axially from the end frame to increase a cooling capacity of the end frame.

5. The rectifier of claim 4 wherein the positive heat sink includes a plurality of fins extending from a perimeter of the positive heat sink defining pathways between the positive heat sink and the outer wall of the end frame, the pathways configured to allow cooling air to flow therethrough.

6. A rectifier for a dynamoelectric machine comprising:
an end frame having at least one negative diode disposed therein, the at least one negative diode electrically connectable to a stator winding of the dynamoelectric machine;
a positive heat sink having at least one positive diode disposed therein, the at least one positive diode electrically connectable the stator winding of the dynamoelectric machine; and
a terminal assembly including:
a plurality of bosses, one boss of the plurality of bosses disposed at each negative diode of the at least one negative diode and each positive diode of the at least one positive diode; and
one or more electrically conductive and heat dissipative straps configured to facilitate uninterrupted welded connection to substantially uninsulated portions of one or more negative diodes and one or more positive diodes, the straps configured as substantially bare and extending between bosses of the plurality of bosses.

7. The rectifier of claim 6 wherein the one or more straps are disposed in a configuration such that each positive diode and each negative diode are electrically connected to said plurality of straps.

8. The rectifier of claim 6 wherein the end frame includes at least one vent slot to increase a flow of cooling air through the rectifier.

9. The rectifier of claim 6 wherein the end frame includes an outer wall disposed at least partially perimetrically around and extending axially from the end frame to increase a cooling capacity of the end frame.

10. The rectifier of claim 9 wherein the positive heat sink includes a plurality of fins extending from a perimeter of the positive heat sink defining pathways between the positive heat sink and the outer wall of the end frame, the pathways configured to allow cooling air to flow therethrough.

11. A rectifier for a dynamoelectric machine comprising:
an end frame having at least one negative diode disposed therein, the at least one negative diode electrically connectable to a stator winding of the dynamoelectric machine;
a positive heat sink having at least one positive diode disposed therein, the at least one positive diode electrically connectable the stator winding of the dynamoelectric machine; and
a terminal assembly including one or more substantially bare electrically conductive and heat dissipative straps, the straps electrically connecting one or more negative diodes and one or more positive diodes.

12. The rectifier of claim 11 wherein the one or more straps are disposed in a configuration such that each positive diode and each negative diode are electrically connected to said plurality of straps.

13. The rectifier of claim 11 wherein the end frame includes six negative diodes and the positive heat sink includes six positive diodes.

14. The rectifier of claim 11 wherein two positive diodes and two negative diodes are electrically connected to each phase of the stator winding.

15. The rectifier of claim 14 wherein the one or more straps connect the two positive diodes and two negative diodes electrically connected to each phase of the stator winding in a parallel configuration.

16. The rectifier of claim 11 wherein the end frame includes at least one vent slot to increase a flow of cooling air through the rectifier.

17. The rectifier of claim 11 wherein the end frame includes an outer wall disposed at least partially perimetrically around and extending axially from the end frame to increase a cooling capacity of the end frame.

18. The rectifier of claim 17 wherein the positive heat sink includes a plurality of fins extending from a perimeter of the positive heat sink defining pathways between the positive heat sink and the outer wall of the end frame, the pathways configured to allow cooling air to flow therethrough.

19. A method for dissipating heat from a rectifier of a dynamoelectric machine, the method comprising:
conducting heat into an end frame from at least one negative diode disposed therein, the at least one negative diode electrically connectable to a stator winding of the dynamoelectric machine;
conducting heat into a positive heat sink from at least one positive diode disposed therein, the at least one positive diode electrically connectable to said stator winding of the dynamoelectric machine;
further conducting heat from the at least one negative diode and at least one positive diode into one or more substantially bare electrically conductive and heat dissipative straps of a terminal assembly, the straps electrically connecting one or more negative diodes and one or more positive diodes;
urging cooling air through the rectifier to radiate heat from the end frame, the positive heat sink, and/or the straps.

20. The method of claim 19 wherein the straps are disposed in a configuration such that each positive diode and each negative diode are electrically connected to a plurality of straps.

21. The method of claim 19 wherein the end frame includes at least one vent slot to increase a flow of cooling air through the rectifier.

22. The method of claim 19 wherein the end frame includes an outer wall disposed at least partially perimetrically around and extending axially from the end frame to increase a cooling capacity of the end frame.

23. The method of claim 22 wherein the positive heat sink includes a plurality of fins extending from a perimeter of the positive heat sink defining pathways between the positive heat sink and the outer wall of the end frame, the pathways configured to allow cooling air to flow therethrough.

* * * * *